US007951649B2

(12) United States Patent
Val (10) Patent No.: US 7,951,649 B2
(45) Date of Patent: May 31, 2011

(54) PROCESS FOR THE COLLECTIVE FABRICATION OF 3D ELECTRONIC MODULES (75) Inventor: Christian Val, St Remy les Chevreuse (FR)

(73) Assignee: 3D Plus (FR)

( * ) Notice: Subject to any disclaimer, the term of this patent is extended or adjusted under 35 U.S.C. 154(b) by 294 days.

(21) Appl. No.: 12/438,179

(22) PCT Filed: Aug. 3, 2007

(86) PCT No.: PCT/EP2007/058090
§ 371 (c)(1),
(2), (4) Date: Feb. 20, 2009

(87) PCT Pub. No.: WO2008/022901
PCT Pub. Date: Feb. 28, 2008

(65) Prior Publication Data
US 2009/0209052 A1 Aug. 20, 2009

(30) Foreign Application Priority Data
Aug. 22, 2006 (FR) ...................................... 06 07442

(51) Int. Cl.
H01L 21/50 (2006.01)
(52) U.S. Cl. ........ 438/113; 438/106; 438/107; 438/109; 438/110; 438/114; 438/119
(58) Field of Classification Search .................. 438/106, 438/107, 109, 110, 113, 114, 119
See application file for complete search history.

(56) References Cited

U.S. PATENT DOCUMENTS
4,216,444 A 8/1980 Vergnolle et al.
(Continued)

FOREIGN PATENT DOCUMENTS
EP 1041620 A2 10/2000
(Continued)

OTHER PUBLICATIONS
U.S. Appl. No. 10/333,855, filed Jan. 24, 2003, Christian Val (Now Abandoned).
(Continued)

Primary Examiner — Thanh V Pham
(74) Attorney, Agent, or Firm — Lowe Hauptman Ham & Berner, LLP (57) ABSTRACT The invention relates to the collective fabrication of n 3D module. It comprises a step of fabricating a batch of n dies i at one and the same thin plane wafer (10) of thickness $e_s$ comprising silicon, covered on one face with electrical connection pads (20), called test pads, and then with a thin electrically insulating layer (4) of thickness $e_i$, forming the insulating substrate provided with at least one silicon electronic component (11) having connection pads (2) connected to the test pads (20) through the insulating layer. The components are encapsulated in an insulating resin (6) of thickness $e_r$, filling the spaces between the components, then separated from one another by first grooves (30) with a width L1 and a depth P1 such that $e_i+e_r<P1<e_i+e_r+e_s$, the connection pads of components (2) being connected to tracks (3) that are flush with the grooves (30);

B1) a step of depositing an adhesive support (40) on the component-side face;

C1) a step of removing the silicon wafer (10) so as to expose the test pads (20);

D1) a step of electrically testing the components of the wafer via the test pad (20) and of marking the valid components (11') and/or defective components; and E1) a step of bonding the dies (50) onto an adhesive film (41), each die comprising a valid component (11') connected to test pads (20) and to at least one track (3), insulating resin (6), and an insulating layer (4), the dies being separated by second grooves (31) of width L2 with which the connection tracks (3) of the valid components (11') are flush.

This step, repeated K times, is followed by a step of stacking the K wafers, of forming metallized holes in the thickness of the stack, which are intended for connecting the dies together, and then of dicing the stack in order to obtain the n 3D modules.

20 Claims, 5 Drawing Sheets

U.S. PATENT DOCUMENTS

| | | | |
|---|---|---|---|
| 4,408,256 A | 10/1983 | Val | |
| 4,413,170 A | 11/1983 | Val et al. | |
| 4,518,818 A | 5/1985 | Le Ny et al. | |
| 4,546,028 A | 10/1985 | Val | |
| 4,553,020 A | 11/1985 | Val | |
| 4,559,579 A | 12/1985 | Val | |
| 4,639,826 A | 1/1987 | Val et al. | |
| 4,654,694 A | 3/1987 | Val | |
| 4,755,910 A | 7/1988 | Val | |
| 5,002,895 A | 3/1991 | Le Parquier et al. | |
| 5,237,204 A | 8/1993 | Val | |
| 5,323,533 A | 6/1994 | Val | |
| 5,400,218 A | 3/1995 | Val | |
| 5,461,545 A | 10/1995 | Leroy et al. | |
| 5,526,230 A | 6/1996 | Val | |
| 5,637,536 A | 6/1997 | Val | |
| 5,640,760 A | 6/1997 | Val et al. | |
| 5,847,448 A | 12/1998 | Val et al. | |
| 5,885,850 A | 3/1999 | Val | |
| 6,307,261 B1 | 10/2001 | Val et al. | |
| 6,716,672 B2 | 4/2004 | Val | |
| 6,809,367 B2 | 10/2004 | Val | |
| 7,476,965 B2 | 1/2009 | Val et al. | |
| 2003/0173673 A1 | 9/2003 | Val | |
| 2005/0012188 A1 | 1/2005 | Val | |
| 2007/0117369 A1 | 5/2007 | Val et al. | |
| 2008/0170374 A1 | 7/2008 | Val | |
| 2008/0289174 A1 | 11/2008 | Val | |
| 2008/0316727 A1 | 12/2008 | Val et al. | |

FOREIGN PATENT DOCUMENTS

| | | |
|---|---|---|
| JP | 2001-210782 | 8/2001 |
| JP | 2001-332685 A | 11/2001 |

OTHER PUBLICATIONS

U.S. Appl. No. 10/494,421, filed May 5, 2004, Christian Val (Now Abandoned).

U.S. Patent Application No. 89 361, filed Oct. 30, 1979, (Abandoned Feb. 27, 1981).

U.S. Patent Application No. 148 043, filed Feb. 8, 1982, (Abandoned Feb. 8, 1982).

U.S. Patent Application No. 201870, filed Nov. 30, 1980, (Abandoned Nov. 9, 1990).

U.S. Patent Application No. 221437, filed Dec. 30, 1980, (Abandoned Jun. 30, 1982).

U.S. Patent Application No. 274205, filed Dec. 30, 1980, (Abandoned Dec. 2, 1983).

U.S. Patent Application No. 296 650, filed Aug. 27, 1981, (Abandoned Jan. 4, 1984).

U.S. Patent Application No. 507 808, filed Jun. 24, 1983, (Abandoned Feb. 2, 1996).

U.S. Patent Application No. 735 731, filed May 20, 1985, (Abandoned May 20, 1985).

U.S. Patent Application No. 131 238, filed Dec. 7, 1987, (Abandoned Jun. 6, 1989).

U.S. Patent Application No. 361 694, filed Jun. 20, 1989, (Abandoned Aug. 26, 1991).

U.S. Patent Application No. 030 854, filed May 12, 1987, (Abandoned Aug. 1, 1988).

U.S. Patent Application No. 226 512, filed Aug. 1, 1988, (Abandoned Nov. 15, 1989).

U.S. Patent Application No. 920 073, filed Oct. 16, 1986, (Abandoned Sep. 22, 1989).

U.S. Patent Application No. 026 228, filed Jan. 29, 1987, (Abandoned Apr. 2, 1996).

U.S. Patent Application No. 092 295, filed Sep. 2, 1987, (Abandoned Jan. 12, 1989).

U.S. Patent Application No. 296 797, filed Jan. 12, 1989, (Abandoned Sep. 15, 1989).

U.S. Patent Application No. 407 532, filed Sep. 15, 1989, (Abandoned May 21, 1990).

U.S. Patent Application No. 527 714, filed May 21, 1990, (Abandoned Oct. 28, 1991).

U.S. Patent Application No. 181 740, filed Apr. 14, 1988, (Abandoned Nov. 3, 1989).

U.S. Patent Application No. 272 376, filed Nov. 17, 1988, (Abandoned Jul. 8, 1991).

U.S. Appl. No. 07/728,325, filed Jul. 8, 1991, (Abandoned Dec. 10, 1992).

U.S. Appl. No. 07/989,871, filed Dec. 10, 1992, (Abandoned Aug. 13, 1993).

U.S. Appl. No. 08/604,752, filed Feb. 23, 1996, (Abandoned Jun. 12, 1998).

U.S. Appl. No. 08/351,407, filed Apr. 15, 1994, (Abandoned Sep. 4, 1996).

U.S. Appl. No. 08/544,478, filed Oct. 18, 1995, (Abandoned Mar. 3, 1997).

U.S. Appl. No. 12/258,060, filed Oct. 24, 2008.

U.S. Appl. No. 07/844,631, filed Aug. 23, 1991, Michel Leroy (Abandoned).

U.S. Appl. No. 07/920,482, filed Dec. 6, 1991, Christian Val (Abandoned).

U.S. Appl. No. 08/289,855, filed Aug. 12, 1994, Christian Val (Abandoned).

PROCESS FOR THE COLLECTIVE FABRICATION OF 3D ELECTRONIC MODULES

CROSS-REFERENCE TO RELATED APPLICATIONS

The present Application is based on International Application No. PCT/EP2007/058090, filed on Aug. 3, 2007, which in turn corresponds to French Application No. 0607442 filed on Aug. 22, 2006, and priority is hereby claimed under 35 USC §119 based on these applications. Each of these applications are hereby incorporated by reference in their entirety into the present application.

FIELD OF THE INVENTION

The field of the invention is that of the fabrication of 3D electronic modules.

BACKGROUND OF THE INVENTION

Figure 1:
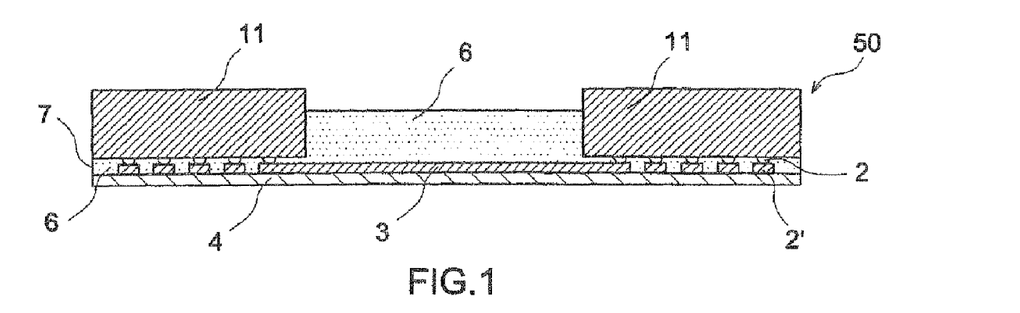
FIG. 1, already described, shows schematically a sectional view of an electronic die of a 3D module according to the prior art.

A 3D electronic module comprises a stack of electronic dies, which are interconnected in three dimensions using the faces of the stack to make the connections between the dies. A die 50, an example of which is shown in FIG. 1, generally comprises one or more active or passive components 11 which have electrical connection elements 2, the components being encapsulated in an electrically insulating resin 6. The connection elements 2 of the components are connected to connection pads 2' on an electrically insulating substrate 4. One or more electrically conducting tracks 3 on the insulating substrate 4 connect these components together or connect them to elements for electrically connecting the dies together. The dies are electrically connected together via conductors located on the lateral faces of the stack, that is to say on the edges 7 of the dies.

Several methods exist for connecting the pads 2 of the component to the pads 2' of the substrate.

One method consists in connecting the pads of the component directly to those of the insulating substrate by sending ultrasound waves. The energy sent is proportional to the number of pads to be connected. For components having a large number of pads, the energy needed for the connection sometimes causes the component to break. One solution for reducing this energy consists in heating the substrate, which then softens and adsorbs some of the ultrasonic energy sent, thereby making the connection very difficult. Furthermore, during encapsulation of the components, by curing carried out at about 150° C., the substrate tends to become curved since the expansion coefficient of the components is different from that of the substrate, typically four times smaller.

The dies thus obtained are electrically tested one by one so as to remove the dies having a defective component before they are stacked, in order to obtain a 3D electronic module.

SUMMARY OF THE INVENTION

The subject of the invention is to alleviate these drawbacks in order to produce 3D modules having no defective components.

The principle of the invention is to maintain good material continuity between the component and the substrate during fabrication in order to avoid differences in expansion during the connection step and/or curing step, while allowing a collective electrical test to be carried out. In this way, the stacking step for producing the 3D electronic modules is carried out only with dies having valid components.

More precisely, the subject of the invention is a process for the fabrication of n electronic modules, n being an integer greater than 1, a module comprising a stack of K electronic dies, a die i, i varying from 1 to K, comprising at least one electronic component on an insulating substrate, the K dies being electrically connected together by conductors located on the lateral faces of the stack, characterized in that the fabrication is collective and comprises:

a first step consisting, for each die i, of:

A1) a step of fabricating a batch of n dies i on one and the same thin plane wafer of thickness $e_s$ comprising silicon, covered on one face with electrical connection pads, called test pads, and then with a thin electrically insulating layer of thickness $e_i$, forming the insulating substrate and provided with at least one silicon electronic component comprising connection pads connected to the test pads through said insulating layer, the components being encapsulated in an insulating resin of thickness $e_r$, filling the spaces between the components, then separated from one another by first grooves with a width L1 and a depth P1 such that $e_i+e_r<P1<e_i+e_r+e_s$, the connection pads of the components being connected to tracks that are flush with the grooves;

B1) a step of depositing an adhesive support on the component-side face;

C1) a step of removing the silicon wafer so as to expose the test pads;

D1) a step of electrically testing the components of the wafer via the test pads and of marking the valid components and/or defective components; and E1) a step of bonding the valid dies onto an adhesive film, each die comprising a valid component connected to test pads, insulating resin, an insulating layer and at least one track, the dies being separated by second grooves of width L2 with which the connection tracks of the valid components are flush; and a second step consisting in:

A2) stacking and assembling the K batches obtained after the first step, so as to superpose the second grooves, substantially one ontop of another;

B2) forming third grooves in the stacks at the second grooves, with a width $L3 \geq L2$; and C2) interconnecting the dies at the wall of the third grooves.

This process makes it possible to isolate the dies so as to test them collectively on the wafer, to reconstitute another wafer with valid components and to make these third grooves wide enough so as to obtain much sharper conducting track sections at these grooves.

The process thus makes it possible for 3D modules having no defective components to be produced collectively.

Preferably, it includes, prior to the step of depositing an adhesive support on the component-side face, a step of thinning that face of the wafer comprising the components by surfacing.

Advantageously, L2<L1.

According to one feature of the invention, the stacking of step A2 is carried out on a support and it includes, after the metallization step C2, a step of dicing this support along the third grooves for the purpose of obtaining the n 3D electronic modules.

The electronic component may be an active component or a passive component or an MEMS (MicroElectroMechanical System).

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE DRAWINGS

A 3D electronic module comprises a stack of K electronic dies 50. A die i, i varying from 1 to K, comprises at least one electronic component 11 on an insulating substrate 4. A component typically has a thickness between 50 µm and 500 µm. The component may be an active component, such as a chip (diode, transistor, integrated circuit, etc.), or a conventional passive component, such as a capacitor. This may also be a passive component etched in the silicon, known by the term MEMS (MicroElectroMechanical System) providing functions of the following types: sensor, actuator, switch, etc. The MEMS is placed in a cavity protected by a cover.

The K dies are electrically connected together via conductors located on the lateral faces of the stack. K is for example equal to 4, but typically varies between 2 and 100.

The invention relates to the fabrication of n modules having only validated components (n being between 2 and 100 depending on their size) this fabrication being collective.

It includes a step of fabricating a batch of n dies i on one and the same wafer, this step being repeated K times, and then a step of stacking the K wafers and of forming grooves in the thickness of the stack, which are intended for connecting the dies together, in order to obtain the n 3D modules.

A batch of n dies i is obtained after several substeps described in relation to FIGS. 2 to 8.

Figure 2:
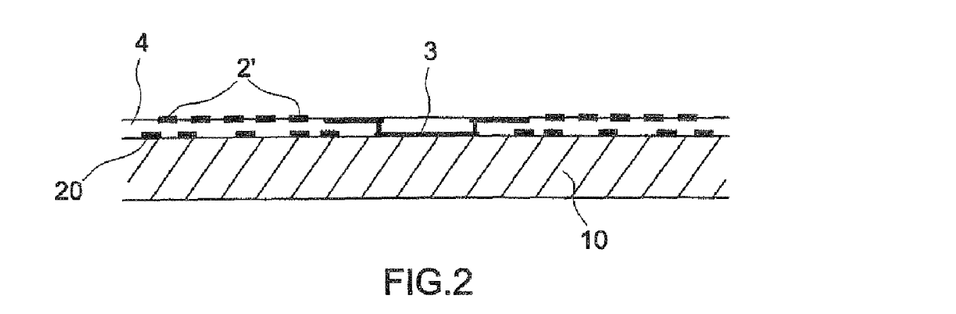
FIG. 2 shows schematically a sectional view of the first step of the process for the collective fabrication of 3D modules according to the invention.
Figure 3:
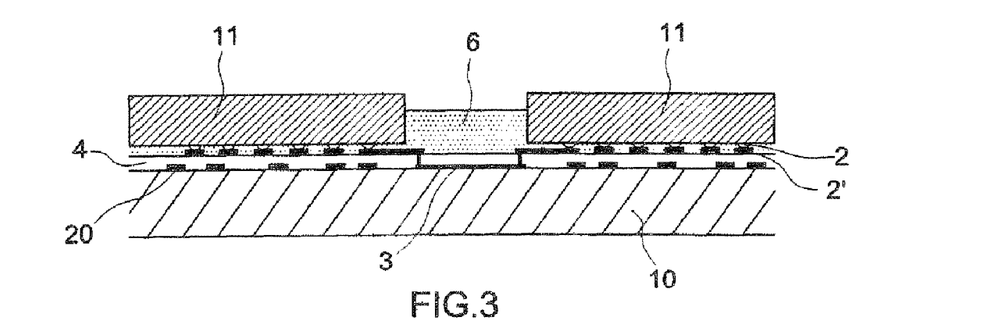
FIG. 3 shows schematically a sectional view of the second step, namely the mounting of the components, of the process according to the invention.

A thin plane wafer 10 of thickness $e_s$ comprising silicon is covered on one face with electrical connection pads 20, called test pads, and then with a thin electrically insulating layer of thickness $e_i$ of a few µm, forming the insulating substrate 4, said layer being provided with at least n electronic silicon components 11, the connection pads 2 or bumps of which, connected to connection pads 2', are connected to the test pads through said insulating layer (FIGS. 2 and 3). The thin insulating layer 4 is for example made of a photoetchable insulating resin. The components 11 are bonded onto the insulating substrate, with the active face towards the substrate, using a flip-chip method by melting their bumps or by stud bumping. This stud bumping process consists in bonding gold balls using a thermosonic method well known for gold wire bonding.

The components 11 are encapsulated in an insulating resin 6 of thickness $e_r$, filling the spaces between the components 11 and between the components 11 and the insulating layer 4 (FIG. 3).

The thickness $e_i$ is typically between 5 and 20 µm and $e_r$ between 50 and 500 µm.

The thickness of the wafer 10 is of the order of a few hundred µm. Passive components are optionally already in the wafer in the upper part thereof at a depth of about 10-20 µm. This wafer 10 provides a continuous support for the fabrication of the batch of n dies i. This is for example a circular wafer with a diameter of about 25 cm.

Figure 4:
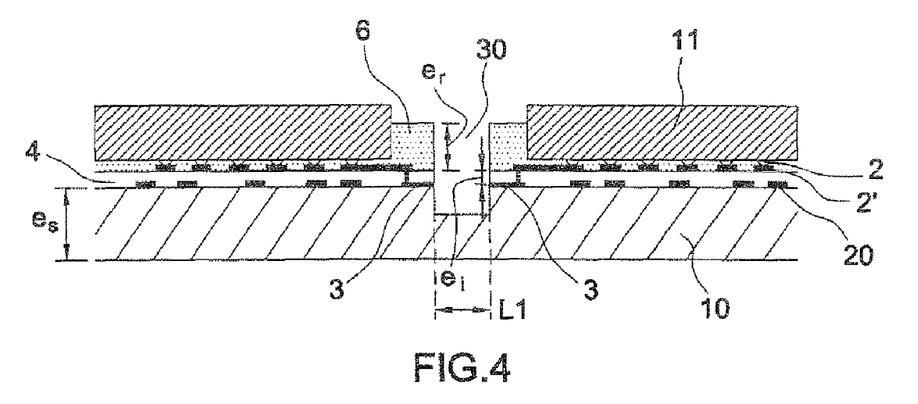
FIG. 4 shows schematically a sectional view of the third step, namely the cutting of first grooves, of the process according to the invention.
Figure 5:
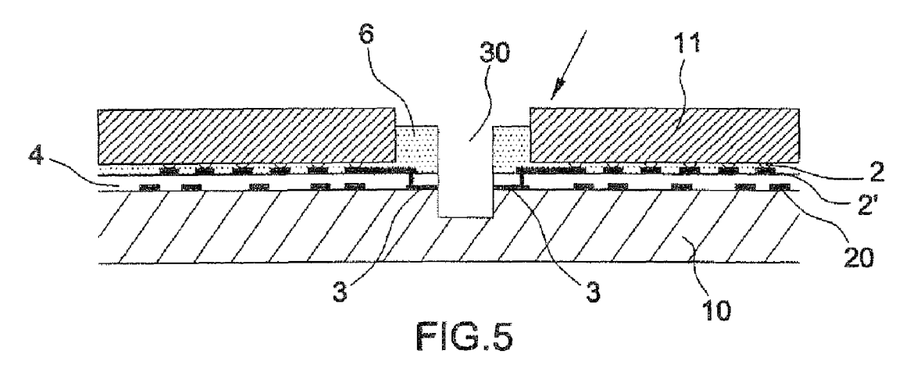
FIG. 5 shows schematically a sectional view of the fourth step, namely surfacing, of the process according to the invention.

With a view to electrically testing each component, the components are then separated from one another by first grooves 30 of width L1 and depth P1 such that $e_i+e_r<P1<e_i+e_r+e_s$. These grooves, cut into the insulating resin 6, are for example obtained by sawing (FIG. 4). Typically, L1 is within 25 and 75 µm. The connection pads 2 of the components are connected to electrical interconnection elements of the component, such as tracks 3 that are flush with these grooves 30. In the figures, the tracks are level with the test pads 20 but they may also be level with the connection pads 2'.

Preferably, the process furthermore includes a step consisting in thinning the wafer provided with its components, by heterogeneous surfacing of the wafer on the component side, that is to say by surfacing applied non-selectively both to the components 11 and optionally to the resin 6 encapsulating them. This surfacing operation, carried out for example by polishing, is indicated by an arrow in FIG. 5. In general, the term "wafer" denotes the entire structure obtained as the fabrication process proceeds. This collective surfacing may be carried out before the first grooves are produced. The surfacing is carried out by mechanical or chemical abrasion. The thickness of the wafer with its components is then reduced.

Figure 6:
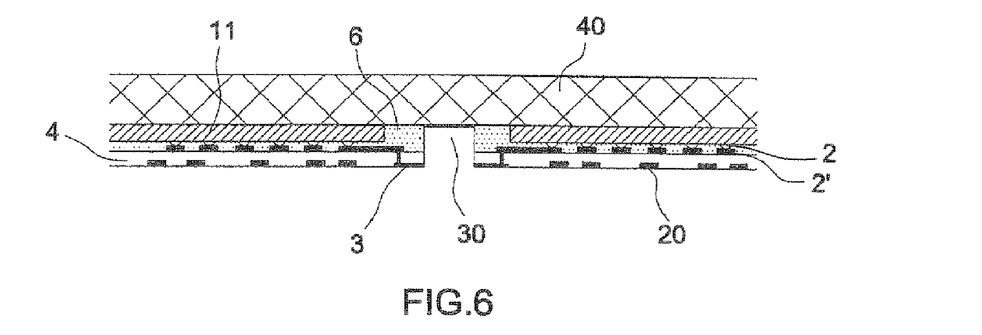
FIG. 6 shows schematically a sectional view of the fifth step, namely the chemical etching of the silicon wafer, of the process according to the invention.
Figure 7:
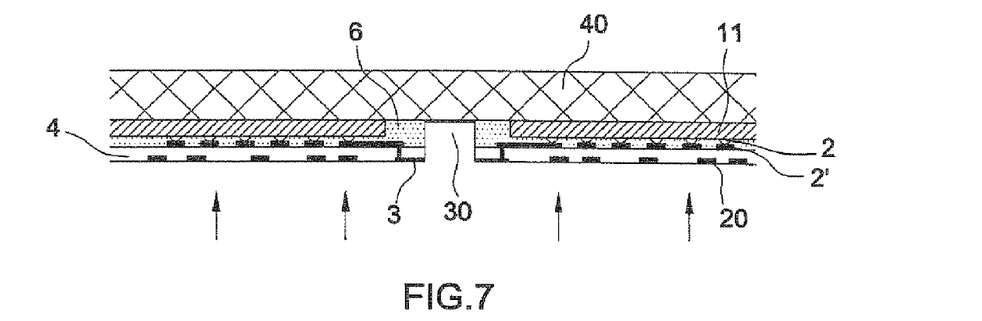
FIG. 7 shows schematically a sectional view of the sixth step, namely the electrical testing of the components, of the process according to the invention.

An adhesive support 40 is deposited on the side with the components 11, on the optionally surfaced face, and the starting silicon wafer 10 is removed, for example by chemical etching, so as to expose the test pads 20 (FIG. 6). This adhesive support may be an adhesive sheet such as for example a sheet of polyvinyl chloride, commonly called a drumskin, which can be debonded, without any special treatment, for example by peeling. This sheet makes it possible to dispense with adhesive bonding of the components, which requires a heat treatment to cure the adhesive and an acid chemical treatment to remove it. After this step, the wafer has a thickness of about 100 µm, more generally between 50 µm and 200 µm.

The components of the wafer are then electrically tested by means of the test pads 20 and are marked according to whether they are valid or defective. The test is indicated by arrows in FIG. 7. This marking may simply consist in setting aside the defective dies. The term "valid die" denotes the element comprising a valid component 11' connected to test pads 20 and to at least one conducting track 3, the resin 6 and the insulating layer 4. In this way, the test is carried out collectively, rather than individually on each module obtained.

Figure 8:
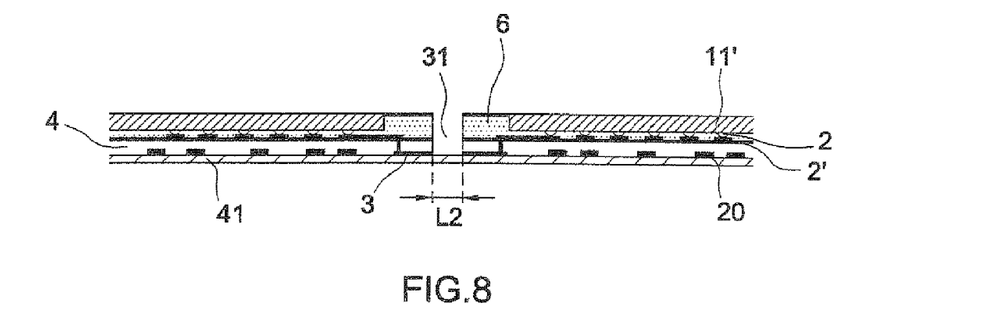
FIG. 8 shows schematically a sectional view of the seventh step, namely reconstitution of a new wafer having only validated components, of the process according to the invention.

The tested dies that are valid are detached from the adhesive support 40 of the wafer and bonded onto another substrate 41 such as another adhesive film of the type described above, so as to reconstitute a second wafer called a "known good wafer", having only valid components 11' (FIG. 8). The dies are bonded to the substrate 41 so as to leave a minimal inter-die space in order to place the maximum number of dies per unit area. These separating spaces form grooves 31 of width L2, where preferably L2<L1, with which the tracks 3 connected to the connection pads of the components 2 are flush. No resin is deposited in these grooves 31.

The collective fabrication of this batch of n dies 50 is repeated K times for the purpose of obtaining the K known good wafers.

Figure 9:
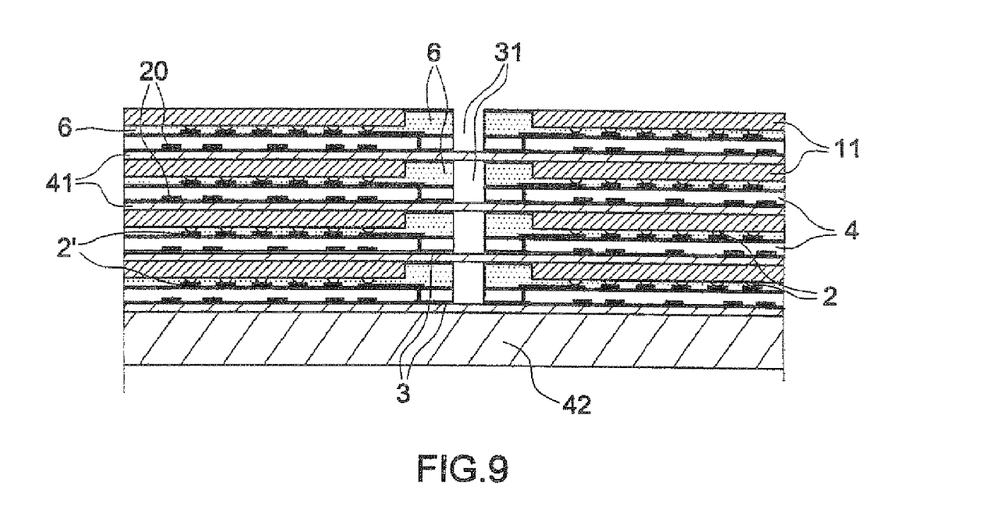
FIG. 9 shows schematically, a sectional view of the eighth step, namely the stacking of the reconstituted wafers, of the process according to the invention.

A second step, comprising substeps described in relation to FIGS. 9 to 12, consists in stacking the K batches of known good wafers obtained after the first step, as illustrated in FIG. 9 with K=4, so as to superpose the second grooves 31 of each batch, substantially one ontop of another. The wafers are stacked ontop of one another, for example by means of adhesives. Preferably, the stack is produced on an adhesive support 42 or drumskin, with a thickness of about 25 µm. The second grooves preferably but not necessarily, have the same dimensions. Third grooves 32 are then formed for the entire thickness of the stack plumb with the grooves 31 with a width L3 (FIG. 10) greater than L2, less than L1 so that the tracks 3 are flush with the wall of these third grooves. These grooves are for example obtained by sawing.

Figure 10:
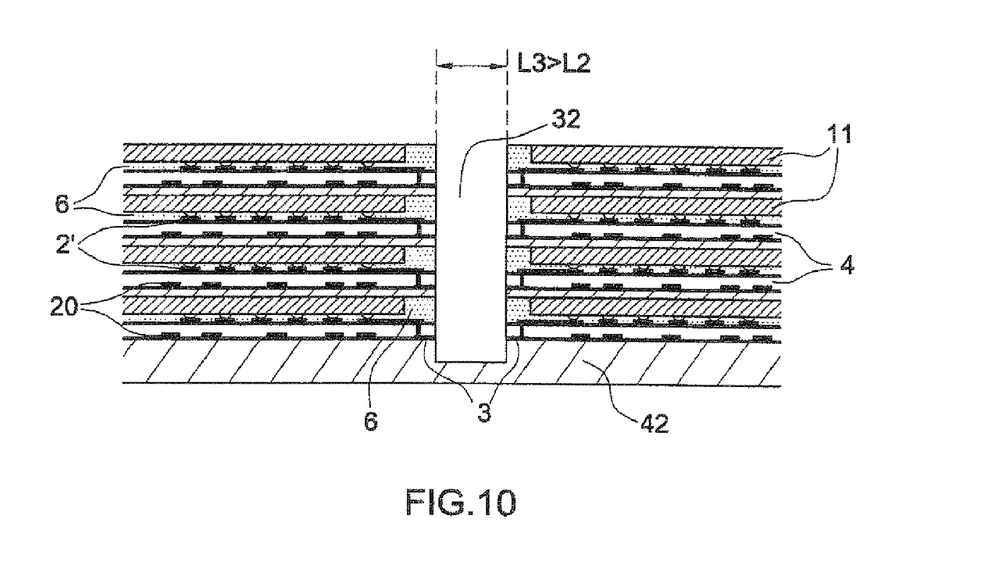
FIG. 10 shows schematically a sectional view of the ninth step, namely the cutting of second grooves, of the process according to the invention.
Figure 11:
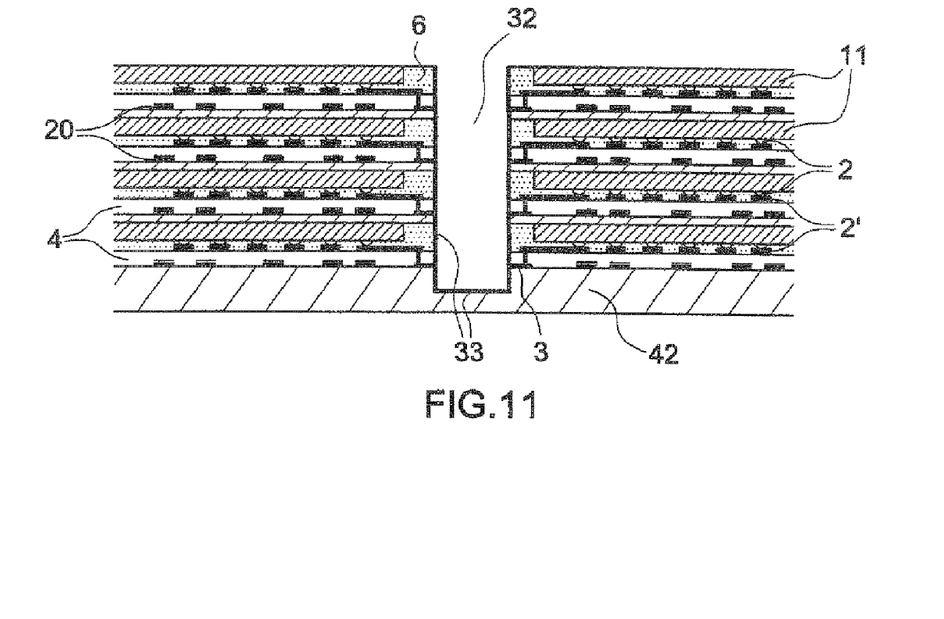
FIG. 11 shows schematically a sectional view of the tenth step, namely the metallization of the second grooves, of the process according to the invention.

The transverse dimension L3 of the grooves 32 is greater than L2 and preferably greater than L1, on the one hand to compensate for any misalignment when stacking the K known good wafers and, on the other hand, so that the tracks 3 connected to the connection pads of the components are flush with the grooves. L3 is for example between 50 µm and 100 µm.

The wall of the grooves 32 is then metallized with a metal layer 33 (FIG. 11) by chemical and/or electrochemical deposition or by vacuum sputtering, short-circuiting all of the tracks terminating on the wall of the holes. The optional adhesive support 42 is cut off in the extension of the holes 32 so as to obtain the n electronic modules. This cutting is for example carried out by sawing.

Figure 12:
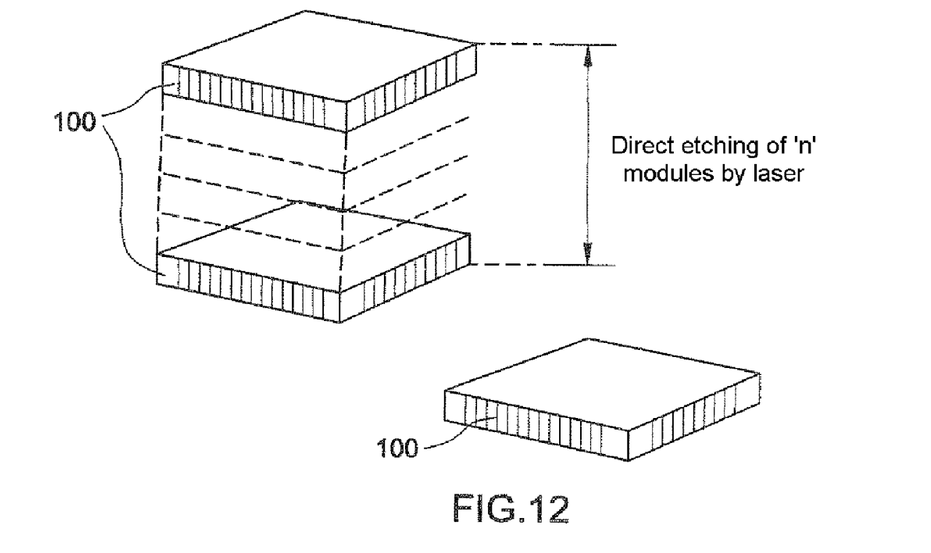
FIG. 12 shows schematically a sectional view of the eleventh step, namely the etching of the lateral faces of the n modules, of the process according to the invention.

A step of etching the n modules, for example by a laser, serves to isolate the groups of tracks in order to form the die interconnection scheme (FIG. 12). After this step, the n 3D modules 100, one example of which is shown in FIG. 12, are obtained. This etching is advantageously carried out collectively. For this purpose, modules are stacked (for example around one hundred of them) against two reference edges, formed by a set-square, prior to this etching.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. Process for the fabrication of n electronic modules, n being an integer greater than 1, a module having a stack of K electronic dies, a die i, i varying from 1 to K, having at least one electronic component on an insulating substrate, the K dies being electrically connected together by conductors located on the lateral faces of the stack, fabrication is collective comprising:
a first step having, for each die i, of:
A1) a step of fabricating a batch of n dies i on one and the same thin plane wafer of thickness $e_s$ having silicon, covered on one face with electrical connection test pads, and then with a thin electrically insulating layer of thickness $e_i$, forming the insulating substrate and provided with at least one silicon electronic component having connection pads connected to the test pads through said insulating layer, the components being encapsulated in an insulating resin of thickness $e_r$, filling the spaces between the components, then separated from one another by first grooves with a width L1 and a depth P1 such that $e_i+e_r<P1<e_i+e_r+e_s$, the connection pads of the components being connected to tracks that are flush with the grooves;
B1) a step of depositing an adhesive support on the component-side face;
C1) a step of removing the silicon wafer so as to expose the test pads;
D1) a step of electrically testing the components of the wafer via the test pads and of marking the valid components and/or defective components; and
E1) a step of bonding the dies onto an adhesive film, each die comprising a valid component connected to test pads and to at least one track, insulating resin, and an insulating layer, the dies being separated by second grooves of width L2 with which the connection tracks of the valid components are flush; and
a second step consisting in:
A2) stacking and assembling the K batches obtained after the first step, so as to superpose the second grooves, substantially one ontop of another;
B2) forming third grooves in the stacks at the second grooves, with a width $L3 \geq L2$; and
C2) interconnecting the dies at the wall of the third grooves.

2. Process according to claim 1, wherein L2<L1.

3. Process according to claim 1, including, prior to the step of depositing an adhesive support on the component-side face, a step of thinning that face of the wafer comprising the components by surfacing.

4. Process according to claim 1, wherein step C2 comprises the steps comprising:
metallizing the wall of the third grooves by means of a metal layer; and
forming a die interconnection scheme in said metal layer.

5. Process according to claim 1, wherein the stacking of step A2 is carried out on a support.

6. Process according to claim 1, wherein the electronic component is an active or passive component or an MEMS.

7. Process according to claim 6, wherein the active component is a chip.

8. Process according to claim 1, wherein least one passive component is located in the wafer or on the wafer.

9. Process according to claim 2, including, prior to the step of depositing an adhesive support on the component-side face, a step of thinning that face of the wafer comprising the components by surfacing.

10. Process according to claim 2, step C2 comprises the steps comprising:
   metallizing the wall of the third grooves by means of a metal layer; and
   forming a die interconnection scheme in said metal layer.

11. Process according to claim 3, step C2 comprises the steps comprising:
   metallizing the wall of the third grooves by means of a metal layer; and
   forming a die interconnection scheme in said metal layer.

12. Process according to claim 2, wherein the stacking of step A2 is carried out on a support.

13. Process according to claim 3, wherein the stacking of step A2 is carried out on a support.

14. Process according to claim 4, wherein the stacking of step A2 is carried out on a support.

15. Process according to claim 2, wherein the electronic component is an active or passive component or an MEMS.

16. Process according to claim 3, wherein the electronic component is an active or passive component or an MEMS.

17. Process according to claim 4, wherein the electronic component is an active or passive component or an MEMS.

18. Process according to claim 5, wherein the electronic component is an active or passive component or an MEMS.

19. Process according to claim 2, wherein least one passive component is located in the wafer or on the wafer.

20. Process according to claim 3, wherein least one passive component is located in the wafer or on the wafer.

* * * * *